(12) United States Patent
Robinson

(10) Patent No.: US 8,125,055 B2
(45) Date of Patent: Feb. 28, 2012

(54) PACKAGING TECHNOLOGY

(75) Inventor: Peter John Robinson, Cambridgeshore (GB)

(73) Assignee: Cambridge Silicon Radio Ltd. (GB)

( * ) Notice: Subject to any disclaimer, the term of this patent is extended or adjusted under 35 U.S.C. 154(b) by 146 days.

(21) Appl. No.: 12/557,945

(22) Filed: Sep. 11, 2009

(65) Prior Publication Data

US 2010/0078772 A1    Apr. 1, 2010

(30) Foreign Application Priority Data

Sep. 30, 2008    (GB) .................................. 0817831.1

(51) Int. Cl.
*H01L 29/40* (2006.01)
(52) U.S. Cl. ......... 257/621; 257/E23.011; 257/E21.599; 438/460; 438/462

(58) Field of Classification Search .................. 257/618, 257/620, 621, E21.523, E21.524, 698, 777, 257/E23.011, E21.599; 438/462, 460
See application file for complete search history.

(56) References Cited

U.S. PATENT DOCUMENTS

| 6,489,686 | B2* | 12/2002 | Farooq et al. | 257/777 |
| 7,495,331 | B2* | 2/2009 | Ito et al. | 257/698 |
| 7,807,503 | B2* | 10/2010 | Doan | 438/109 |

* cited by examiner

*Primary Examiner* — Jasmine Clark
(74) *Attorney, Agent, or Firm* — Greenberg Traurig, LLP

(57) ABSTRACT

Metallized through silicon vias located in the scribe lanes between die are used to create an electrical connection between the front-side and the rear-side of a silicon die. One of the metallization layers on the front-side of the die comprises portions which extend into the scribe lanes to form capture pads for the through silicon vias. The rear-side of the wafer is metallized and this metallization may, in some embodiments, be patterned to form tracks or components. The silicon die may be used to create improved package on package devices. In other examples, other substrate materials may be used.

18 Claims, 10 Drawing Sheets

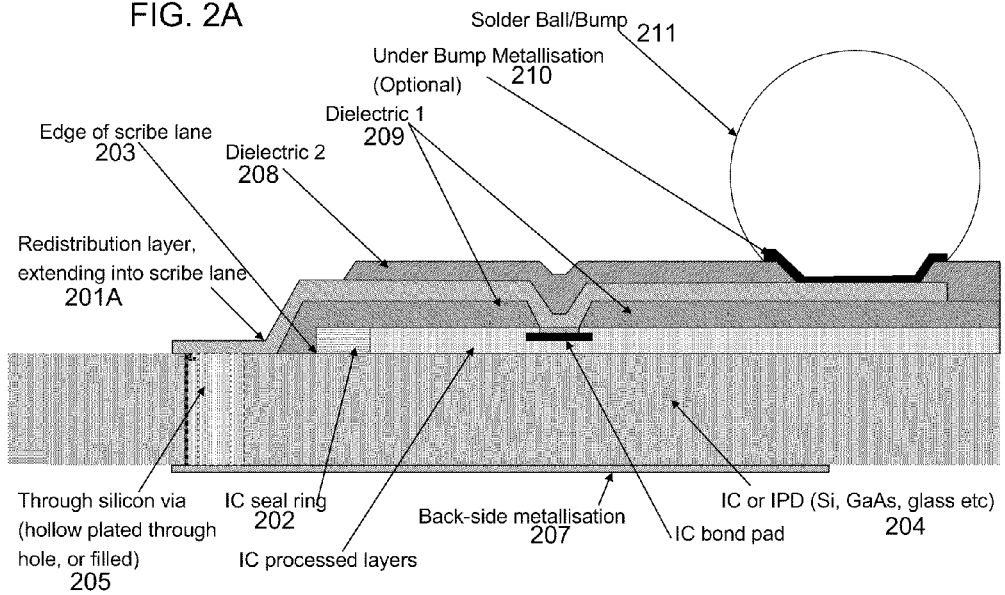
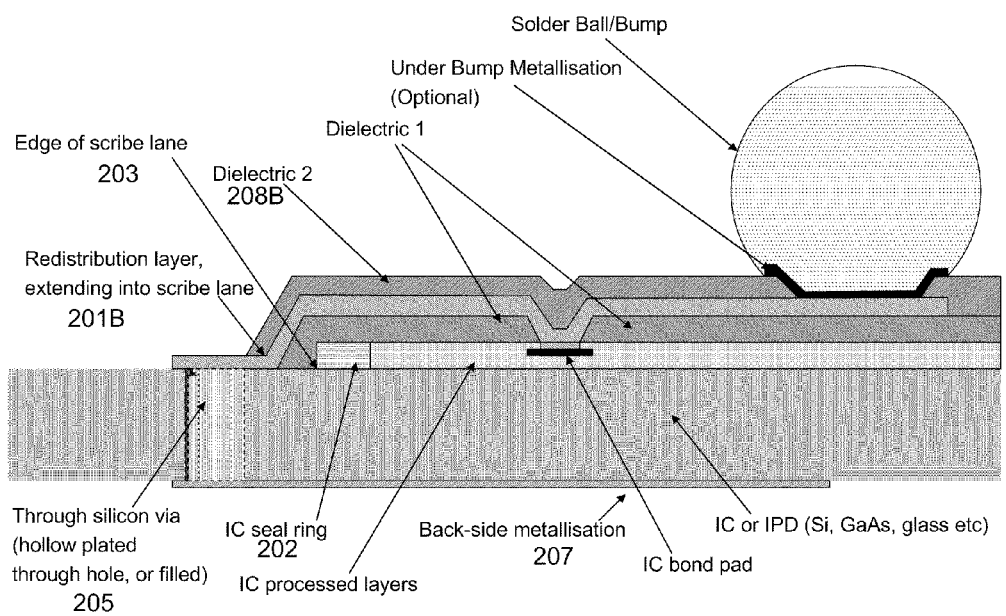

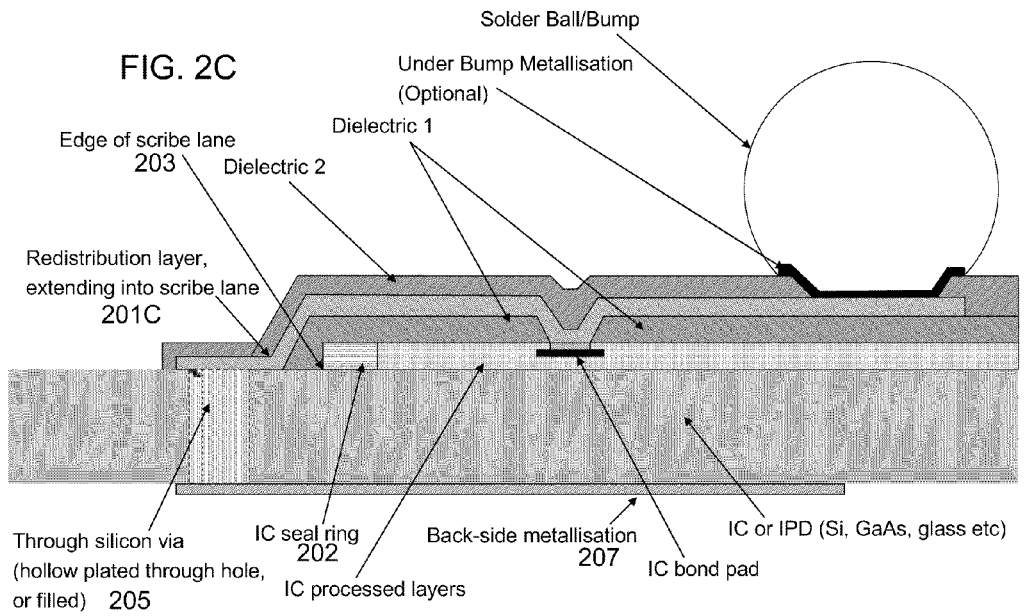
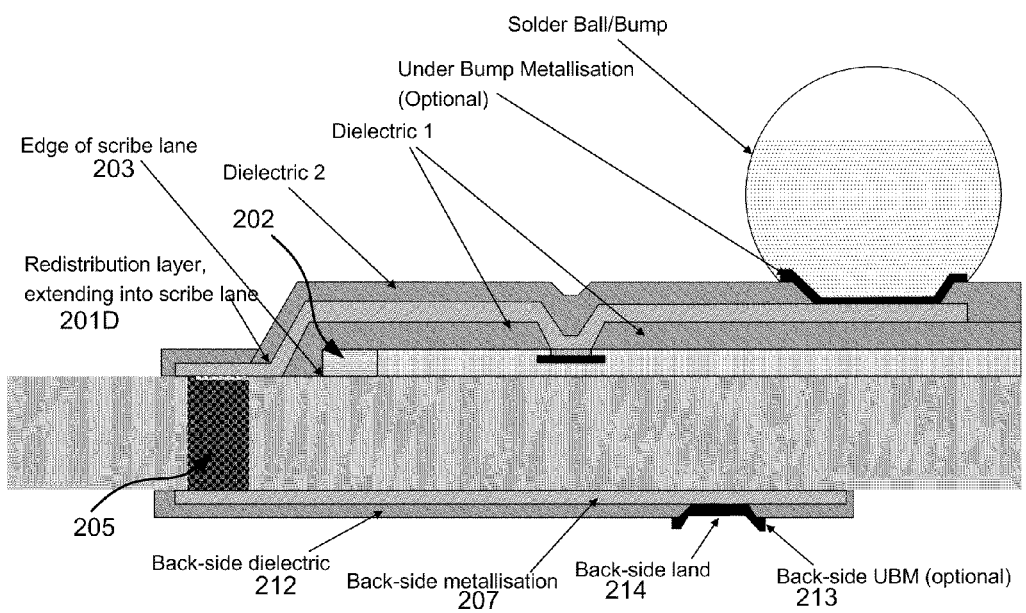

FIG. 5D
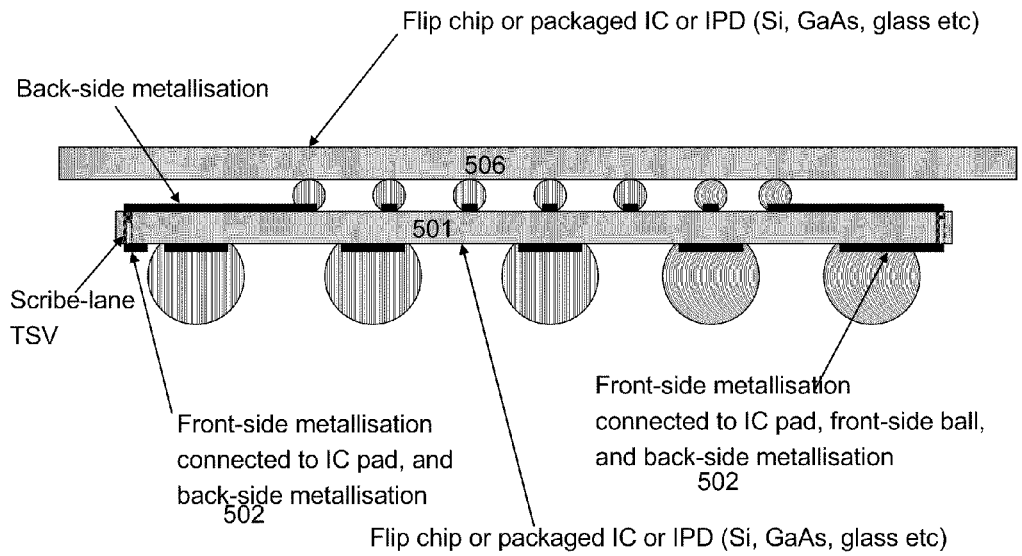
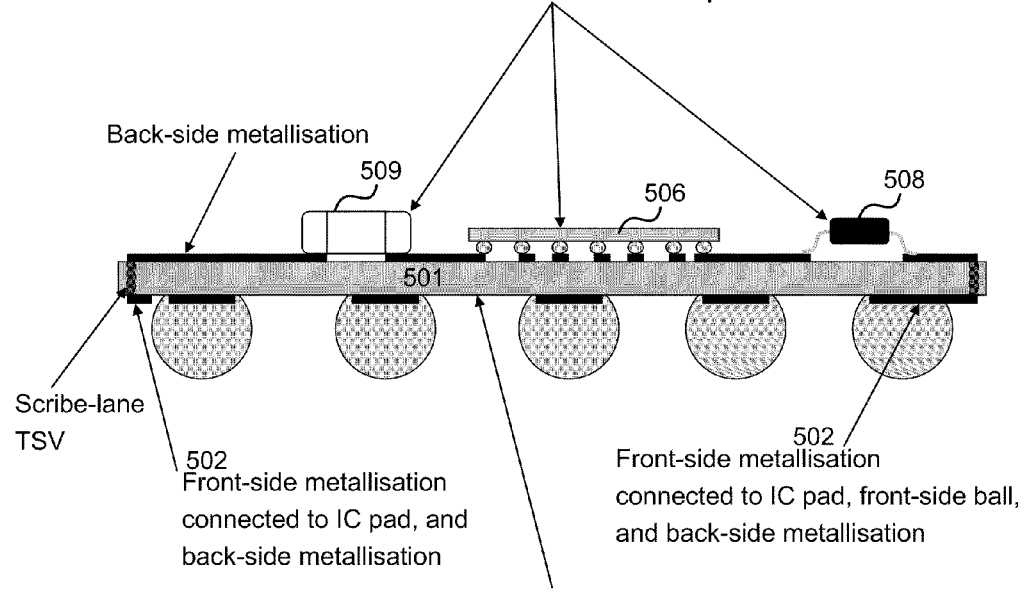
FIG. 5E

PACKAGING TECHNOLOGY

BACKGROUND

Package-on-package (PoP) technology is a 3D packaging technology in which packaged silicon die can be stacked on top of each other, for example as shown in FIG. 1. This technology can be used to reduce the overall size of a printed circuit board (PCB) and example applications include mobile telephones, where a memory chip may be mounted on top of a logic chip. FIG. 1 shows a schematic diagram of an example PoP in which a lower die 101 is mounted on a substrate 102 and an upper die 103 is mounted on a substrate 104. Each of these packaged die may be tested before the upper die 103 and substrate 104 are mounted on the lower substrate 102.

By using PoP technology the density of die on a PCB can be increased; however such packages are considerably bigger than the die themselves and there is a desire to reduce the overall size of packaged die further to enable enhanced integration and to use PCB space more efficiently. Moreover, increasing the package size to facilitate package-to-package connections increases the package cost, through increased material usage, and reduction of the number of packages in an assembly lot.

The embodiments described below are not limited to implementations which solve any or all of the disadvantages of known packaging techniques.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An improved packaging technology is described. Metallised through silicon vias (TSVs) located in the scribe lanes between die are used to create an electrical connection between the front-side and the rear-side of a silicon die. One of the metallisation layers on the front-side of the die comprises portions which extend into the scribe lanes to form capture pads for the through silicon vias. The rear-side of the wafer is metallised and this metallisation may, in some embodiments, be patterned to form tracks or components. The silicon die may be used to create improved PoP devices. In other examples, other substrate materials may be used.

A first aspect provides a method of fabricating a silicon die comprising: forming a layer of patterned metallisation on a front-side of a processed wafer, the layer comprising at least one portion of metallisation that extends into a scribe lane between die to form a capture pad in the scribe lane; forming at least one through substrate via in the scribe lane in a position aligned to the capture pad; metallising the at least one through substrate via and at least a portion of a rear-side of the wafer; and dicing the wafer along scribe lanes into individual die. The at least one portion of metallisation may extend beyond a die seal ring and into the scribe lane between the die.

The layer of patterned metallisation may be a layer from a post-processing process, such as the wafer level chip scale packaging process.

The method may comprise: prior to forming the layer of patterned metallisation, depositing and patterning a first dielectric layer on the front-side of the wafer; and after forming the layer of patterned metallisation, depositing at least one additional layer on the front-side of the wafer.

The processed wafer may comprise a part-processed wafer of integrated circuits and the layer of patterned metallisation is one of the layers of metallisation forming the integrated circuits.

The method may further comprise: patterning the metallisation on at least a portion of the rear-side of the wafer.

The method may further comprise: depositing at least one additional layer on the rear-side of the wafer.

The processed wafer may be a silicon wafer and the through substrate via may be a through silicon via.

A second aspect provides a die comprising: a front-side and a rear-side; a plurality of metallisation layers deposited on the front-side, wherein at least one metallisation layer comprises a portion that extends into a scribe lane around the periphery of the die; a metallisation layer deposited on the rear-side; and at least a portion of a metallised through substrate via in the scribe lane which electrically connects the at least one metallisation layer on the front-side to the metallisation layer on the rear-side.

The die may further comprise a die seal ring and wherein said portion at least one metallisation layer extends beyond the die seal ring and into the scribe lane. The at least one metallisation layer may comprise a metallisation layer deposited using a post-processing process or a layer within the die.

A metallisation layer deposited on the rear-side may be patterned to form a component. The die may further comprise: a patterned under bump metallisation layer deposited on the rear-side that forms regions for mounting a device, such as an active device or a passive device.

The die may be fabricated on a silicon substrate and wherein the metallised through substrate via comprises a metallised through silicon via.

A third aspect provides a wafer comprising a plurality of die as described above.

A fourth aspect provides a package-on-package device comprising a die as described above.

The package-on-package device may further comprise a second die mounted on the rear-side of said die.

Further aspects provide a method substantially as described with reference to FIG. 4 of the drawings, a silicon die substantially as described with reference to FIGS. 2A-2G and 3 of the drawings and a package-on-package device substantially as described with reference to FIGS. 5A-5E of the drawings.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which:

FIGS. 2A-2G show schematic cross-sectional diagrams of examples of improved die;

FIGS. 5A-5E show schematic diagram of examples of improved package-on-package devices.

Figure 1:
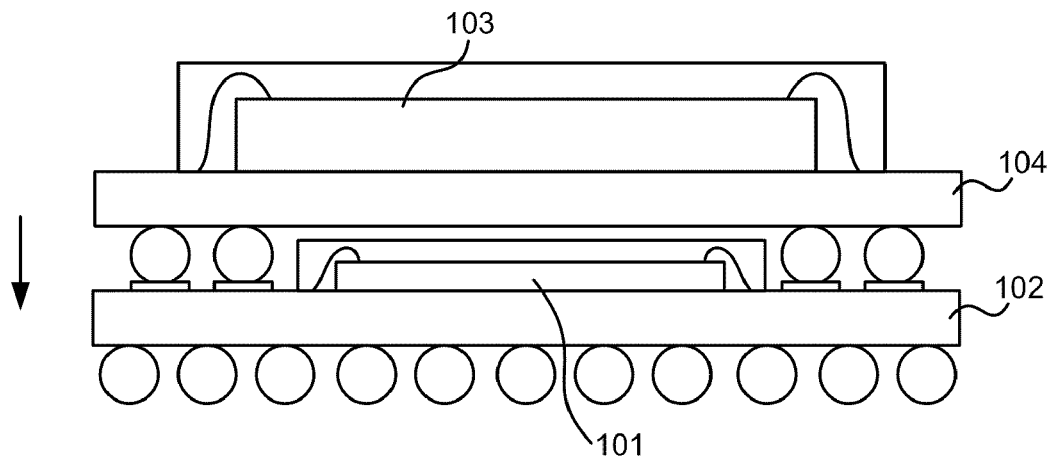
FIG. 1 is a schematic diagram of an example package-on-package.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

FIGS. 2A-2G show schematic cross-sectional diagrams of examples of an improved die which enables a more compact Package-on-package (PoP) to be formed. The die may be a semiconductor device, which is fabricated using substrate 204 such as silicon or gallium arsenide (GaAs), or may be an integrated passive device (IPD), which may be fabricated using a substrate 204 such as silicon or glass. It will be appreciated that the techniques described below may be applied to many different types of devices and many different substrate materials. For the purposes of the following description, a silicon substrate is used by way of example only and the through wafer/substrate vias are referred to as through silicon vias (TSVs).

In each example, a layer of metallisation 201A-201G extends beyond the die seal 202 (e.g. above or through the die seal) and into the scribe lane (the edge of which is indicated by arrow 203) to provide a capture pad for a through-silicon via (TSV) 205 formed within the scribe lane. The TSV 205 is metallised to provide metallisation which wraps around the side of the die and provides an electrical connection to rear-side metallisation 207 (which may also be referred to as back-side metallisation). This rear-side metallisation may cover the whole of the rear of the die, or it may be patterned. The rear-side may be further processed to produce a multi-layer structure on the rear of the die, as shown in FIG. 2D (e.g. layers 207, 212 and 213). In this example, the multi-layer structure (207, 212, 213) creates a back-side land 214.

Figure 2E:
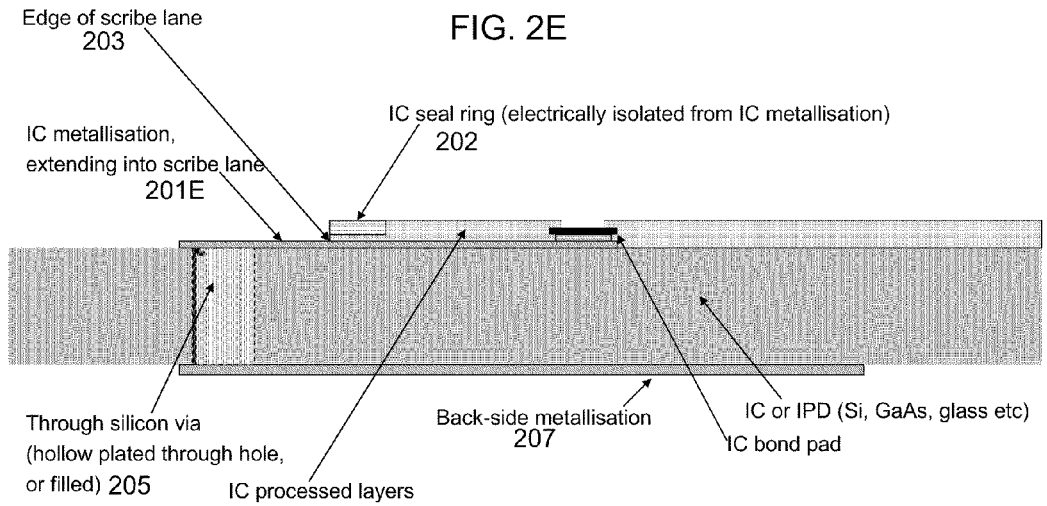

The metallisation 201A-201G which extends into the scribe lane may be one of the die's metallisation layers 201E-201G (as shown in the FIGS. 2E-2G), such as the aluminium pad layer used to cap bond pads or alternatively the die may have been post-processed to add further layers (e.g. dielectric and metallisation layers 201A, 208-211 as shown in FIG. 2A), for example using a wafer-level chip-scale-packaging (WLCSP) process, and the metallisation layer which extends into the scribe lane may be one of these further layers 201A-201D (as shown in FIGS. 2A-2D), e.g. the Re-Distribution layer (RDL). The layer of metallisation 201A-201G which extends beyond the die seal and into the scribe lane may be formed from any metal. Examples include copper or aluminium.

In the example shown in FIG. 2A, the upper dielectric layer 208 is shown is shown as being terminated before the edge of the scribe lane 203. In another example, such as shown in FIG. 2B, the upper dielectric layer 208B may be extended closer to, or even into, the scribe lane in order to provide protection for the metallisation layer 201B. In a corresponding manner, a dielectric layer may be provided over the metallisation layer, e.g. as shown in FIG. 2C. In the example shown in FIG. 2E it is the lowest of the die's metallisation layers 201E which extends into the scribe lane, whereas in the examples shown in FIGS. 2F and 2G it is a mid-layer die metallisation 201F, 201G that extends into the scribe lane. In these three examples, the die seal ring 202 is electrically isolated from the metallisation layer 201E-201G which extends into the scribe lane.

Figure 2F:
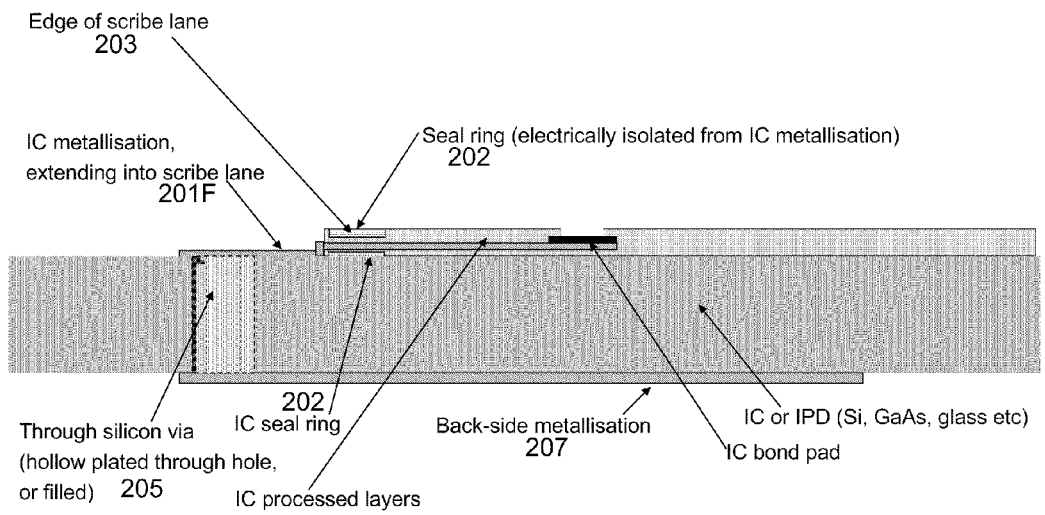
Figure 2G:
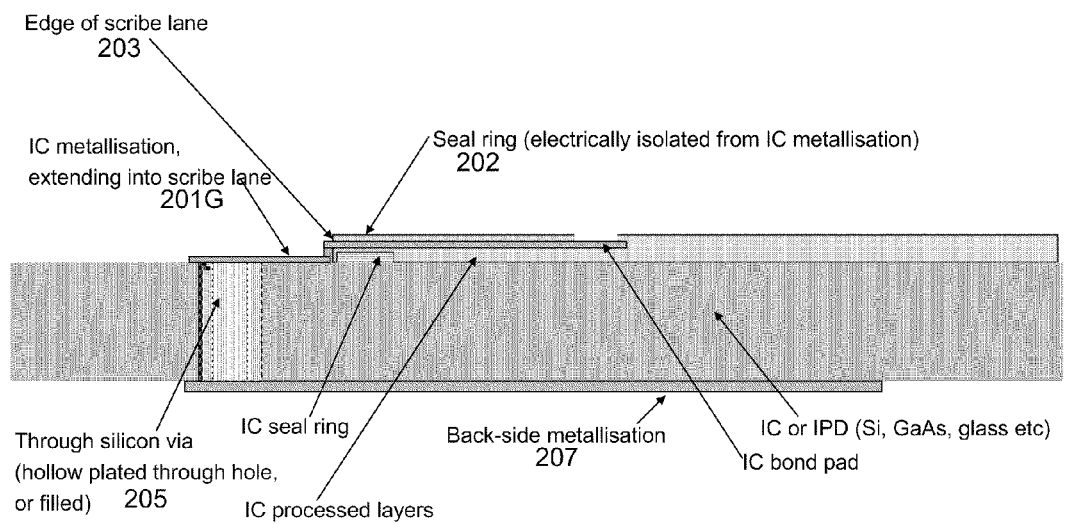

Although the examples in FIGS. 2E-2G do not show post-processing, (e.g. using WLCSP techniques), it will be appreciated that such wafers may be post-processed in any way and additional layers may be added to the front or rear-side of any of the examples shown in FIGS. 2A-2G.

The improved silicon die shown in FIGS. 2A-2G provide a compact die with an electrical connection between the front-side and the rear-side of the die. By placing the TSVs in the scribe lane, they do not occupy costly silicon (or other substrate) real estate or require the size of the die to be increased. Furthermore, the scribe lane TSVs may be integrated with existing die designs and/or can be integrated with future IC designs without incurring additional constraints on IC design/layout (i.e. for ICs which are not specifically designed for TSVs). The die may be used to create improved PoP and this is described in more detail below. The rear-side metallisation (e.g. where it is not patterned) may provide electrical screening (e.g. with the metallisation being grounded via the scribe lane TSVs) and this avoids the need for a separate screening component.

Figure 3:
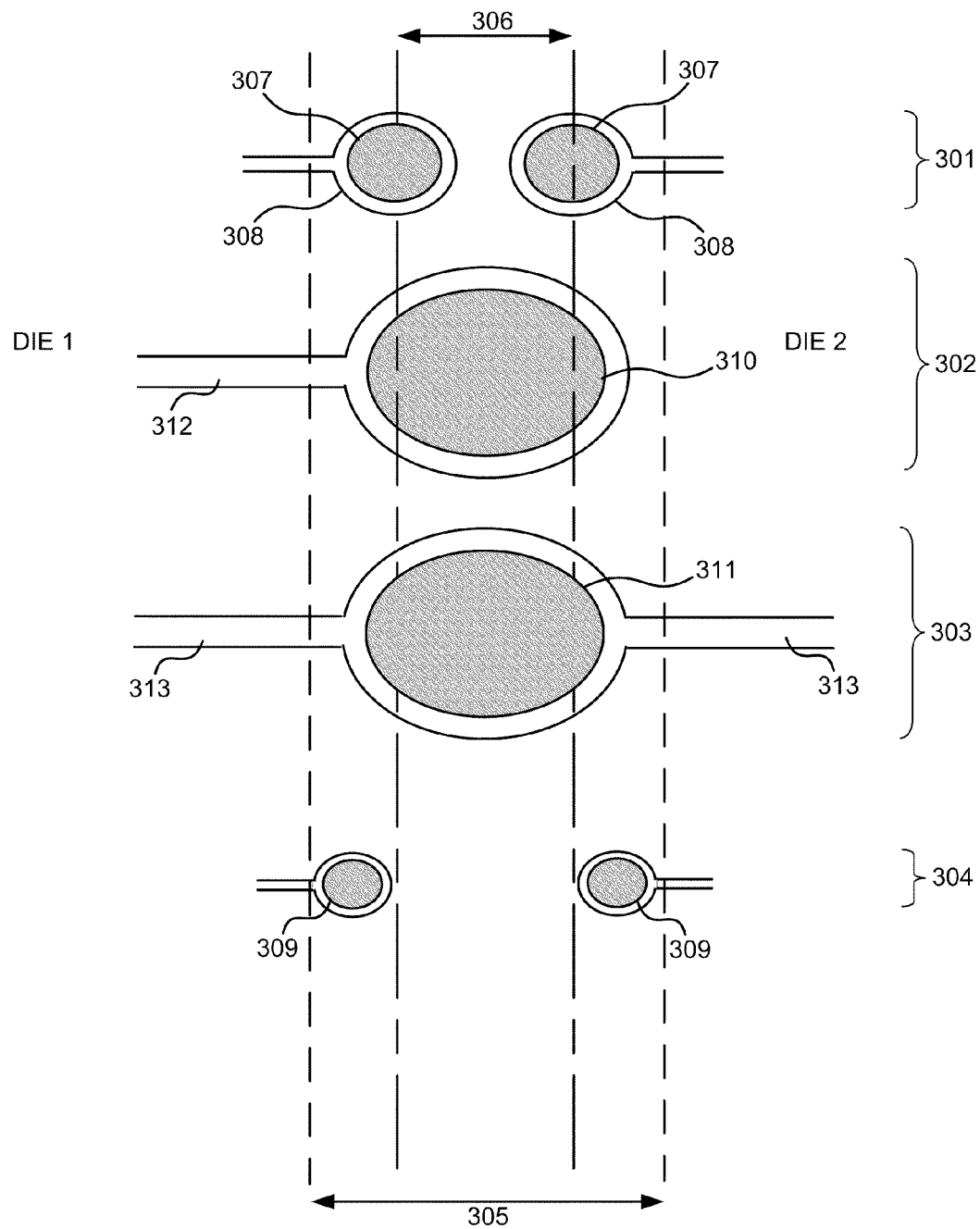
FIG. 3 shows four different example layouts of through silicon via and capture pads.

FIG. 3 shows four different example layouts 301-304 of TSVs and capture pads. Each example shows a different arrangement of the TSV and capture pads with respect to the scribe lane 305 and the area of material 306 which is removed when a processed silicon wafer is diced into individual die. The first example, 301, shows small TSVs 307 (indicated by the shaded area) within larger capture pads 308. In this example, each TSV is partially removed when the wafer is diced. This contrasts to the fourth example, 304, in which the TSVs 309 are within the scribe lane 305 but are not within the area of material 306 removed when the wafer is diced.

The second and third examples, 302, 303, show larger TSVs 310, 311 which are wider than the area of material 306 removed on dicing. Such a larger TSV may provide an electrical wrap-around connection to the two die on either side of the scribe lane (e.g. Die 1 and Die 2 in FIG. 3), e.g. as in the third example 303. In the second example, 302, the metallisation 312 extends into the scribe lane from only one die, whilst in the third example, 303, the metallisation 313 extends into the scribe lane from both die. In an example, the TSVs may have a diameter of around 50 µm and the scribe lane may be around 80 µm wide.

The layouts shown in FIG. 3 are provided by way of example only. It will be appreciated that aspects of any of the examples may be combined to create further examples and that alternative layouts may be used (e.g. non-circular TSVs, non-circular capture pads etc).

Figure 4:
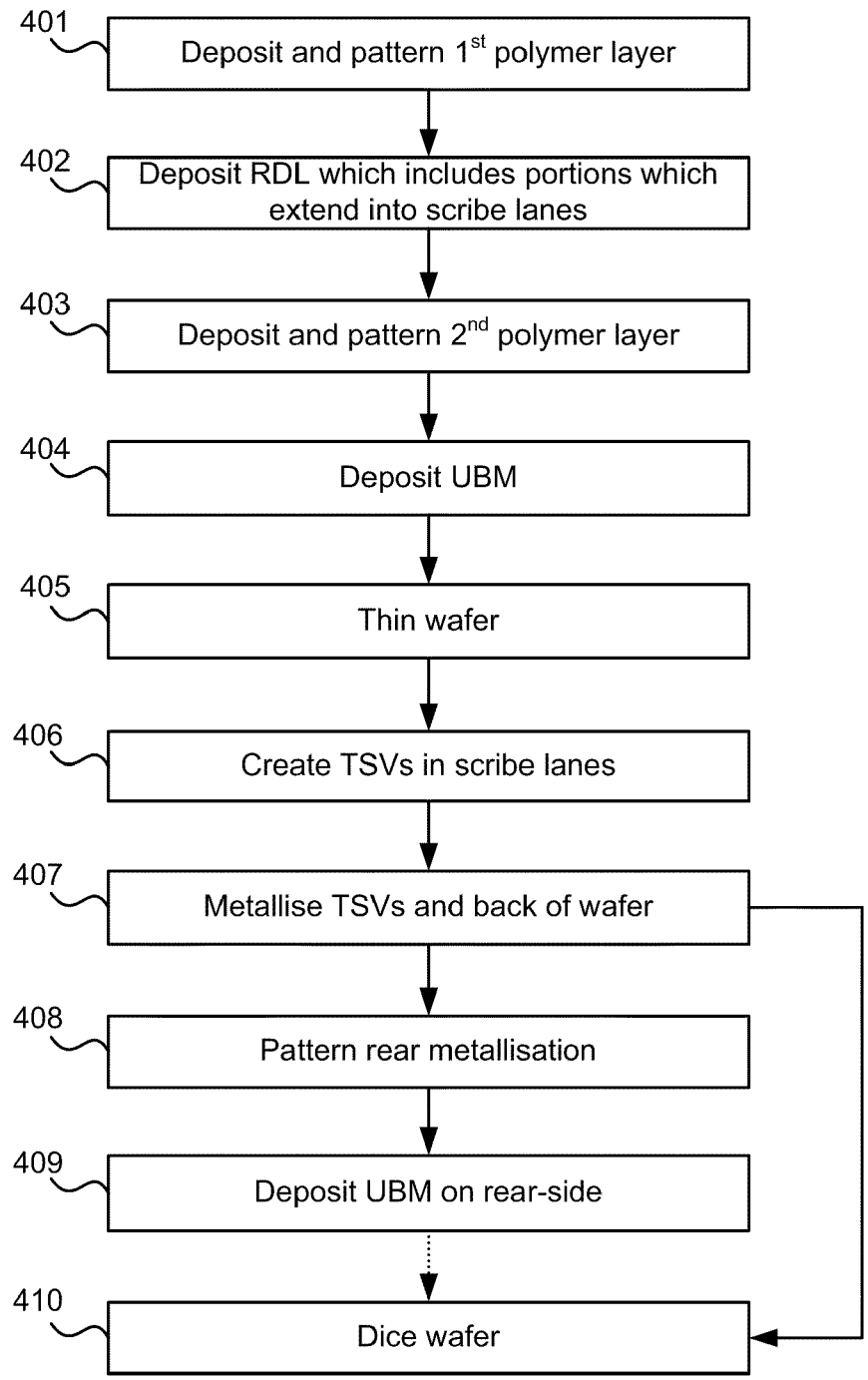
FIG. 4 shows a flow diagram of an example of a modified WLCSP process which incorporates scribe lane through silicon vias.

FIG. 4 shows a flow diagram of an example of a modified WLCSP process which incorporates scribe lane TSVs and provides die with an electrical connection to the rear-side of the die. It will be appreciated that this shows just one example of a modified process which may be used and other processes may be modified in a similar manner to create a wafer of improved silicon die as described above (e.g. other post-processing techniques or die fabrication processes). The WLCSP process may comprise additional process steps and/or a subset of the process steps shown in FIG. 4.

The modified WLCSP process comprises depositing and patterning a first dielectric (e.g. polymer) layer (block 401), e.g. dielectric layer 209 shown in FIG. 2A. This dielectric layer is deposited onto a silicon wafer which has already been processed to create a plurality of active silicon die. The RDL is then deposited (block 402), e.g. metallisation 201A-201D in FIGS. 2A-2D, and depending upon the process used for deposition, the deposited metal may require patterning. This RDL includes portions of metallisation which extend into the scribe lanes to form capture pads for TSVs which will be formed subsequently from the rear-side of the wafer (in block 406). Additional layers may then be deposited, e.g. a dielectric layer 208 and under bump metallisation (UBM) 210 as shown in FIG. 2A (blocks 403, 404). These processing steps may complete the WLCSP processing of the wafer or there may be additional steps, not shown in FIG. 4.

At this stage (or at an earlier stage), the wafer may be thinned (block 405), e.g. by back-grinding. In an example, a wafer may be thinned from 725 μm to 430 μm. Other thinning techniques may alternatively be used or in some examples, the wafer may not be thinned.

The TSVs are then formed in the scribe lanes (block 406) in positions which correspond to the capture pads formed in the RDL (in block 402). In most examples, these TSVs are created from the rear-side of the wafer and techniques such as Deep Reactive Ion Etching (DRIE), plasma etching or laser drilling may be used to form the TSVs. The walls of the TSVs and the back-side of the wafer are then metallised (block 407) and this may be done in a single process step or in multiple process steps (e.g. one to metallise the TSVs and another to metallise the back-side of the wafer). Examples of suitable techniques for metal deposition include, but are not limited to, plating, sputtering and evaporation.

At this point the wafer processing may be complete and the wafer may be diced (block 410) or alternatively the wafer may be further processed. The further processing may include patterning the rear metallisation (block 408), e.g. to form tracks or components on the rear-side of the wafer (e.g. using photolithography and etching). Additional layers may also be deposited on the rear-side, such as dielectric layers or further layers of metallisation, such as a UBM layer (block 409). Where UBM is applied to the back of the WLCSP processed wafer, this may be used to form lands for the attachment of another die or package to create an improved PoP.

When the processed wafer is diced (in block 410), the scribe lanes, and TSVs, may be diced with a cut with (or kerf) which is less than the diameter of the via, to leave a metallised edge connection, e.g. when using the TSV arrangement shown in the second and third examples 302, 303 in FIG. 3. In the first and fourth examples 301, 304 in FIG. 3, there is no relationship between the kerf and the diameter of the TSVs, but the dicing process should leave at least a metallised edge connection. Any suitable dicing technology may be used including, but not limited to, sawing, scribing and cleaving, and laser cutting.

FIG. 4 does not show the attachment of solder balls to the wafer. It will be appreciated that this may be performed on a wafer scale (i.e. before dicing) or after the wafer has been diced. Furthermore, instead of attaching solder balls, a layer of solder may be deposited onto the wafer and patterned (e.g. as part of the WLCSP process following block 404) and then solder bumps may be performed by reflowing the wafer/die (e.g. before/after dicing in block 410). Where solder balls are used, the formation of the TSVs (in block 406) and the subsequent metallisation of the TSVs and rear-side (in blocks 407-408) may be performed before solder ball attach because of the reduced topology of the wafer at this stage. However, in some examples, the TSVs may be formed after solder ball attach.

There are many applications of the methods and improved silicon die described above. These applications include: stacking a memory die on top of another IC (such as a digital base band of a mobile phone); stacking an integrated passive device (IPD) comprising decoupling and filtering on the back of a WLCSP to provide a very compact solution footprint; providing electrical screening (trough completely metallising the rear-side of the WLCSP); and forming components, such as back-side antennas and inductors on the back-side of the WLCSP.

Rear-side processing may be used to form components on the rear-side of a die (e.g. instead of or in addition to block 409 in FIG. 4). An example of a component which may be formed on the rear-side is an antenna. An antenna formed on the die removes the need for an external antenna. Another example of a component which may be formed on the rear-side is an inductor. A spiral inductor may be formed with a central tap via to provide an electrical connection to the centre of the inductor or a multi-layer process may be used to form the inductor. Forming inductors on the rear-side of the die, rather than on the front-side or within the IC itself, increases the distance between the on-chip circuitry and the inductor which reduces coupling and interference, may improve the inductor's Q-factor, and also reduces the die size by removing inductors from the area of the die.

Figure 5A:
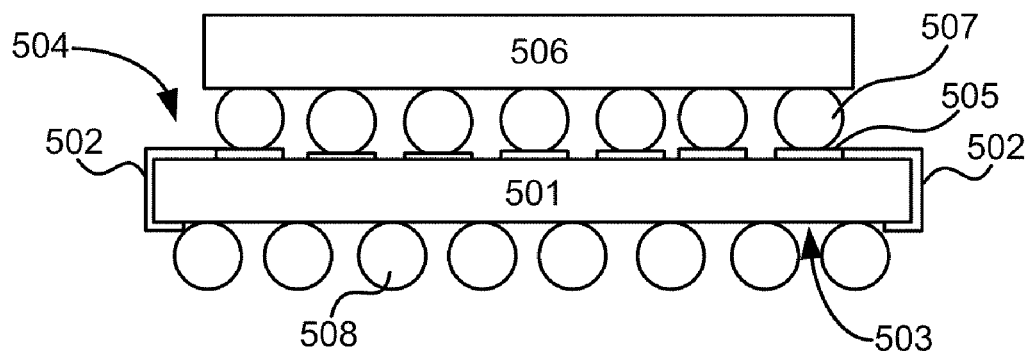
Figure 5B:
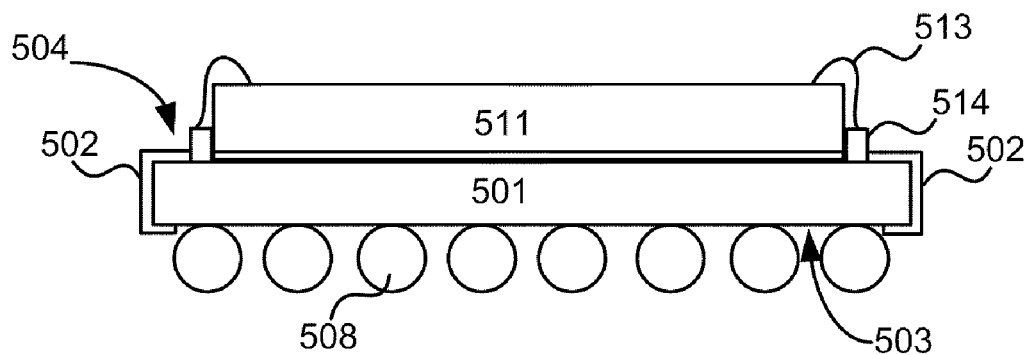

FIGS. 5A-5E show various examples of an improved PoP which use an improved silicon (or other substrate material) die 501 as described above. In each of the examples, scribe lane TSVs provide a wrap around electrical connection 502 between the front-side of the die 503 and the rear-side of the die 504. Lands 505 are formed on the rear-side (e.g. in UBM as deposited in block 409 of FIG. 4) for mounting a second die 506, 511, e.g. using solder balls 507 or solder bumps, as shown in the FIGS. 5A and 5C-5E, or using a larger area of solder or epoxy 512, as shown in FIG. 5B. In FIG. 5A, the second die 506 is mounted front-side down (i.e. front-side of the second die is towards the rear-side of the first die 501), whilst in FIG. 5B, the second die 511 is the other way up (i.e. the rear-side of the second die is towards the rear-side of the first die 501). The resultant PoP may be mounted onto a PCB or other substrate, or onto another die, for example, using solder balls 508 (or solder bumps) on the lower die 501.

In the example shown in FIG. 5A the electrical connections between the upper die 506 and the lower die 501 are provided by means of the solder balls 507 on the upper die. In the example shown in FIG. 5B, the electrical connections are instead provided by wirebonds 513. These wirebonds connect to bond pads 514 which are formed in metallisation on the rear-side of the lower die 501. In a further example, a combination of the two may be used, e.g. solder balls may be used to provide a ground connection to the rear-side of the upper die whilst wirebonds may be used to provide connections to the front-side of the upper die.

Figure 5C:
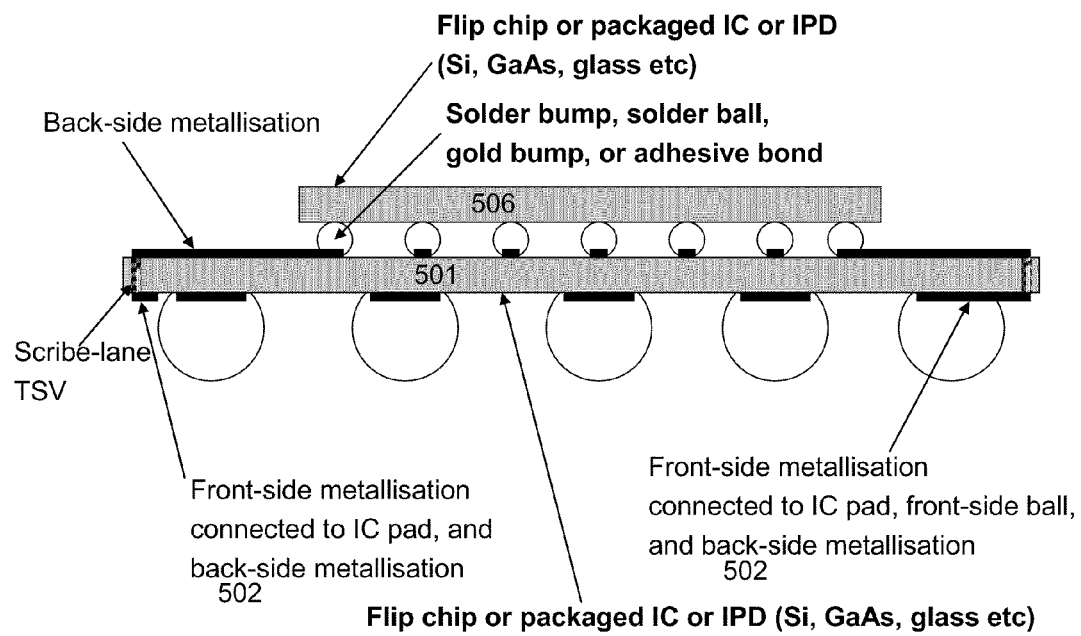

The example shown in FIG. 5C shows an example of a flip-chip PoP in which the upper die 506 may be a flip-chip or packaged IC or IPD and the lower die may be an improved flip-chip or packaged IC or IPD (e.g. as shown in FIGS. 2A-2G and described above). FIG. 5D shows an upper die 506 which is larger than the lower die 501. In the example shown in FIG. 5E multiple components are mounted on the back-side of the lower die 501, e.g. an upper die 506 and various other electrical components 508, 509.

Whilst the upper die 506 is shown as a standard die without scribe lane TSVs, in other examples, the upper die may also comprise scribe lane TSVs and may have rear-side metallisation (e.g. to form components, provide screening or mount die/components). Additionally, more than two die may be stacked to form a PoP.

The improved PoPs shown in FIGS. 5A-5E have a smaller footprint than a standard PoP (e.g. as shown in FIG. 1) because there is no BGA substrate which is larger than the die. The location of the TSVs within the scribe lanes also lead to a reduced size of die compared to a TSV within the body of the die, which would require a large area which is free of any tracks in all layers and would also impose design constraints on the IC design. The improved PoP is also lower cost because of the elimination of the BGA substrates (which typically dominate the cost of a PoP).

The omission of BGA laminate substrates, as required for conventional PoP, results in less material usage, and less assembly processing, making the technology environmentally friendly. The fewer material types used makes for easier recycling.

The improved PoP is also lower profile (i.e. it has a lower height), again because of the elimination of the BGA substrates. The height may be further reduced if the upper die 506 is a low-profile flip-chip die. Additionally, flip-chip underfill may not be required to achieve acceptable temperature cycling reliability because of the matched coefficients of thermal expansion (CTE) between the upper and lower die 506, 501, and the lower mass reduces drop-test forces. There are many applications where height is important (e.g. mobile phone manufacturing) and reduced height enables thinner devices. The omission of underfill (which is enabled by the matched CTE) also provides a reworkable assembly. The matched CTE, along with the fact that the PoP is smaller, has less mass, and less warpage leads to a more reliable and better yielding assembly.

In FIGS. 5A-5E, a second die 506 is mounted on the rear-side of an improved silicon die 501. In other examples, other components may be mounted on the rear-side instead of the second die. Examples of such components include, but are not limited to, active devices such as memory, passive devices such as decoupling capacitors or filters, semiconductor devices, resistors, capacitors, MEMS devices etc. Any suitable technique may be used for mounting e.g. solder, adhesive, electrostatic bonding etc. Some components may require hermetic sealing once they have been bonded onto the rear-side (e.g. a MEMS device, such as an accelerometer). As the rear-side metallisation can be patterned (e.g. in block 408 of FIG. 4) using thin film techniques, the patterning can be fine pitch and therefore devices with fine pitch connections (e.g. memory) may be mounted on the rear-side. The patterning of the rear-side may provide tracks which route between the mounted components and the TSVs which provide electrical connectivity to the front-side of the improved silicon die 501. Components which are mounted on the rear-side may, in some examples, be wire-bonded to provide the electrical connection from the component to the metallisation on the rear-side of the die.

An improved PoP as described herein may be assembled using standard PoP techniques. Furthermore, as the back-side metallisation may be defined using very accurate thin-film processes, it lends itself to fine-pitch flip-chip attachment using solder, anisotropic conducting adhesive, non-conducting adhesive, and thermosonic bonding Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise and exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

What is claimed is:

1. A method of fabricating a die comprising:
    forming a layer of patterned metallisation on a front-side of a processed wafer, the layer comprising at least one portion of metallisation that extends beyond a die seal ring and into a scribe lane between die to form a capture pad in the scribe lane;
    forming at least one through substrate via in the scribe lane in a position aligned to the capture pad;
    metallising the at least one through substrate via and at least a portion of a rear-side of the wafer; and
    dicing the wafer along scribe lanes into individual die.

2. A method according to claim 1, wherein the layer of patterned metallisation is a layer from a post-processing process.

3. A method according to claim 2, wherein the post-processing process is a wafer level chip scale packaging process.

4. A method according to claim 2, further comprising:
    prior to forming the layer of patterned metallisation, depositing and patterning a first dielectric layer on the front-side of the wafer; and
    after forming the layer of patterned metallisation, depositing at least one additional layer on the front-side of the wafer.

5. A method according to claim 1, wherein the processed wafer comprises a part-processed wafer of integrated circuits and the layer of patterned metallisation is one of the layers of metallisation forming the integrated circuits.

6. A method according to claim 1, further comprising:
    patterning the metallisation on at least a portion of the rear-side of the wafer.

7. A method according to claim 6, further comprising:
    depositing at least one additional layer on the rear-side of the wafer.

8. A method according to claim 1, wherein the processed wafer is a silicon wafer and the through substrate via is a through silicon via.

9. A die comprising:
    a front-side and a rear-side;
    a die seal ring;
    a plurality of metallisation layers deposited on the front-side, wherein at least one metallisation layer comprises a portion that extends beyond the die seal ring and into a scribe lane around the periphery of the die;
    a metallisation layer deposited on the rear-side; and
    at least a portion of a metallised through substrate via in the scribe lane which electrically connects the at least one metallisation layer on the front-side to the metallisation layer on the rear-side.

10. A die according to claim 9, wherein the at least one metallisation layer comprises a metallisation layer deposited using a post-processing process.

11. A die according to claim 9, wherein the at least one metallisation layer comprises a layer within the die.

12. A die according to claim 9, wherein a metallisation layer deposited on the rear-side is patterned to form a component.

13. A die according to claim 9, further comprising:
a patterned under bump metallisation layer deposited on the rear-side that forms regions for mounting a device.

14. A die according to claim 13, wherein the device comprises one of: an active device and a passive device.

15. A die according to claim 9 fabricated on a silicon substrate and wherein the metallised through substrate via comprises a metallised through silicon via.

16. A wafer comprising:
a plurality of die, wherein each of the plurality of die comprises:
a front-side and a rear-side;
a die seal ring;
a plurality of metallisation layers deposited on the front-side, wherein at least one metallisation layer comprises a portion that extends beyond the die seal ring and into a scribe lane around the periphery of the die;
a metallisation layer deposited on the rear-side; and
at least a portion of a metallised through substrate via in the scribe lane which electrically connects the at least one metallisation layer on the front-side to the metallisation layer on the rear-side.

17. A package-on-package device comprising:
a die, wherein the die comprises:
a front-side and a rear-side;
a die seal ring;
a plurality of metallisation layers deposited on the front-side, wherein at least one metallisation layer comprises a portion that extends beyond the die seal ring and into a scribe lane around the periphery of the die;
a metallisation layer deposited on the rear-side; and
at least a portion of a metallised through substrate via in the scribe lane which electrically connects the at least one metallisation layer on the front-side to the metallisation layer on the rear-side.

18. A die comprising:
a front-side and a rear-side;
a plurality of metallisation layers deposited on the front-side, wherein at least one metallisation layer within the die comprises a portion that extends into a scribe lane around the periphery of the die;
a metallisation layer deposited on the rear-side; and
at least a portion of a metallised through substrate via in the scribe lane which electrically connects the at least one metallisation layer on the front-side to the metallisation layer on the rear-side.

* * * * *

UNITED STATES PATENT AND TRADEMARK OFFICE
CERTIFICATE OF CORRECTION

PATENT NO. : 8,125,055 B2
APPLICATION NO. : 12/557945
DATED : February 28, 2012
INVENTOR(S) : Peter John Robinson It is certified that error appears in the above-identified patent and that said Letters Patent is hereby corrected as shown below:

On the Cover Page, item (75), under "Inventor", in Column 1, Line 1, delete "Cambridgeshore" and insert -- Cambridgeshire --, therefor.

In Column 5, Line 64, delete "(trough" and insert -- (through --, therefor.

Signed and Sealed this
Tenth Day of July, 2012

David J. Kappos
*Director of the United States Patent and Trademark Office*